(12) United States Patent
Buckheit et al.

(10) Patent No.: US 6,768,961 B2
(45) Date of Patent: Jul. 27, 2004

(54) SYSTEM AND METHOD FOR ANALYZING ERROR INFORMATION FROM A SEMICONDUCTOR FABRICATION PROCESS

(75) Inventors: Jonathan B. Buckheit, Foster City, CA (US); Weidong Wang, Union City, CA (US)

(73) Assignee: Yield Dyamics, Inc., Santa Clara, CA (US)

( * ) Notice: Subject to any disclaimer, the term of this patent is extended or adjusted under 35 U.S.C. 154(b) by 180 days.

(21) Appl. No.: 09/952,848

(22) Filed: Sep. 14, 2001

(65) Prior Publication Data

US 2003/0055592 A1 Mar. 20, 2003

(51) Int. Cl.⁷ .................................................. G06F 3/00
(52) U.S. Cl. ...................... 702/120; 702/119; 702/121; 702/122
(58) Field of Search .......................... 702/119–122, 83, 702/86, 117, 118, 128, 155, 175, 179, 180, 181, 183, 188, 189, 198; 235/454; 324/753; 700/83; 348/8–10; 438/141, 142

(56) References Cited

U.S. PATENT DOCUMENTS

| | | | | |
|---|---|---|---|---|
| 6,037,614 A | * | 3/2000 | He et al. ..................... | 257/184 |
| 6,252,668 B1 | * | 6/2001 | Hill ............................ | 356/487 |
| 6,292,582 B1 | * | 9/2001 | Lin et al. .................... | 382/149 |
| 6,351,712 B1 | * | 2/2002 | Stoughton et al. ............ | 702/19 |
| 6,445,199 B1 | * | 9/2002 | Satya et al. .................. | 324/753 |

* cited by examiner

*Primary Examiner*—Marc S. Hoff
*Assistant Examiner*—Felix Suarez
(74) *Attorney, Agent, or Firm*—Gray Cary Ware & Freidenrich LLP

(57) ABSTRACT

A system and method for analyzing error information from a semiconductor fabrication process. The system receives wafer map data describing a plurality of failing chips on a particular semiconductor wafer. The system utilizes the wafer map data to classify each of the failing chips into one of several error categories, such systematic errors, repeated or reticle errors, and random errors. The system further partitions the systematic errors into spatial clusters, which may be compared against a known library of spatial error patterns for identifying the origins of the systematic errors.

20 Claims, 6 Drawing Sheets

SYSTEM AND METHOD FOR ANALYZING ERROR INFORMATION FROM A SEMICONDUCTOR FABRICATION PROCESS

FIELD OF THE INVENTION

The present invention generally relates to a system and method for analyzing error information from a semiconductor fabrication process, and more particularly, to a system and method which accurately identifies systematic, repeated and random errors from wafer map data acquired during a semiconductor fabrication process.

BACKGROUND OF THE INVENTION

Semiconductors are made in production facilities, commonly referred to as "fabs." A large fab may contain hundreds of automated tools that cooperatively work to convert circular silicon "wafers" (each consisting of dozens, hundreds, and even potentially thousands of chips) into functioning products. A "recipe" determines which operations these various tools perform, and is based upon the end-product that is to be manufactured. Recipes can be quite complicated, involving the use of hundreds of tools, each conducting specialized operations on the wafer, in a specific order, over a period of weeks or even months.

One of the challenges in these fabs is to control the manufacturing equipment and tools in a manner that minimizes variations and defects in the products being produced. For example, the manufacturing equipment and tools used within these fabs have a multitude of parameters which must be examined and controlled in order to minimize variations and errors.

One of the manufacturing tools typically used to manufacture chips is a "stepper." A stepper images portions of the design onto the wafer multiple times, but does so in a step-wise fashion over groups of chips. The grouping of chips used is determined by the "reticle." For example, a reticle layout may specify two rows of two columns of chips (a "two-by-two reticle layout").

An excellent recipe does not guarantee a flawless batch of semiconductors. Random as well as systematic factors affect semiconductor quality. For example, a tool that is instructed to etch a batch of wafers for 1.8 seconds may instead etch for 1.81 seconds due to a slight inaccuracy in the timing mechanism of the tool. Such processing errors may cause several types of problems within chips. As a result, some chips may not function according to various benchmarks such as speed, and these substandard chips are much less valuable than the chips meeting the benchmarks. In addition, many of the substandard chips will not function at all. The percentage of properly functioning chips on a particular wafer is commonly referred to as the "yield" of the wafer.

The overall yield of a wafer may be divided into three unique yield categories. In the first category, systematic yield, the substandard or failing chips result from systematic factors or errors in the fab. Systematic errors can be desirably controlled, reduced and/or substantially eliminated once known. An example of a systematic error would be a tool that is not functioning properly. In the second category, random yield, the substandard or failing chips are caused by random factors or errors in the fab. An example of a random error would be dust that settled on the wafer as it was being fabricated. In the third category, repeated or "reticle" yield, the substandard or failing chips result from repeated factors or errors in the fab (e.g., the chips fail in a pattern consistent with the reticle layout). For example, in a two-by-two reticle layout, if the upper-left chip in each set of such four chips failed, a clear pattern related to the reticle or a reticle error would emerge. It is useful to an engineer in a fab who is tasked with managing chip yields to know which of these three yield factors to attribute certain failures to, because the corrective actions undertaken are highly dependent on the nature of the failures.

Improving yield is a major objective of the semiconductor industry and has a direct economic impact to the semiconductor industry. In particular, a higher yield translates into more devices that may be sold by the manufacturer. In order to improve yield, semiconductor manufacturing companies have implemented systems for collecting and analyzing error data. These prior systems often employ images and image processing algorithms and devices to document and/or identify errors within a wafer and to take action to prevent such errors from occurring in subsequent fabrications.

One device used by these prior systems is a "wafer map." A wafer map provides a display of the chips on a wafer with each chip marked to indicate a result from the production process. For example, chips that pass a certain benchmark may be colored blue, whereas the ones that fail may be colored red. The pass/fail information conveyed by such a wafer map is a way of recording the yield of the wafer.

While such conventional systems and devices are effective to document the presence of errors in wafers, they suffer from some drawbacks. By way of example, these conventional systems provide no means to distinguish and/or identify the specific types of yield factors or errors present in a wafer or group of wafers. That is, these conventional systems only identify the presence of errors, and do not provide information as to whether the errors may be classified as systematic, random or repeated. As a result, output data provided by these conventional systems does not provide a fabrication engineer or professional with the information necessary to take the most effective corrective measures to prevent such problems in future fabrications or processes.

It is therefore desirable to provide a system and method which overcomes the drawbacks and limitations of conventional systems and methods, and which extracts accurate information regarding systematic, random and repeated errors from wafer map data acquired in a semiconductor fabrication process.

SUMMARY OF THE INVENTION

The present invention provides many advantages over conventional error information analysis methods and systems. By way of example and without limitation, the present invention accurately classifies chip errors on a wafer map in a plurality of categories, such as systematic, random and repeated failures. In this manner, the present invention allows a fabrication engineer or professional to provide corrective action which is purposely designed to overcome the specific type of errors or failures encountered.

According to a first aspect of the present invention, a system is provided for analyzing error information describing a plurality of failing chips on a semiconductor wafer. The system includes a controller which is adapted to receive the error information and to classify each of the plurality of failing chips in a unique one of a plurality of error categories.

According to a second aspect of the present invention, a system is provided for analyzing error information describing a plurality of failing chips on a semiconductor wafer. The system includes an input assembly which is adapted to accept and communicate the error information in the form of a wafer map; and a controller which is communicatively coupled to the input assembly and which receives the wafer map from the input assembly. The controller is adapted to classify each of the failing chips in a unique one of the group of categories including systematic failures, repeated failures and random failures, based upon the wafer map.

According to a third aspect of the present invention, a method for analyzing error information from a semiconductor manufacturing process is provided. The method includes the steps of: receiving wafer map data identifying a plurality of failing chips on a semiconductor wafer; and classifying each of the failing chips in a unique one of the group of categories including systematic errors, repeated errors, and random errors.

These and other features and advantages of the invention will become apparent by reference to the following specification and by reference to the following drawings.

DETAILED DESCRIPTION OF A PREFERRED EMBODIMENT OF THE INVENTION

The present invention provides a system and method for analyzing error information from a semiconductor fabrication process, and which categorizes the errors present on a wafer map as systematic, repeated or random failures. In the preferred embodiment, the present invention may be created by and/or constitute or comprise software which resides within a conventional computer system. Alternatively, the present invention may be implemented in hardware or may incorporate other modules or functionality not described herein.

Figure 1:
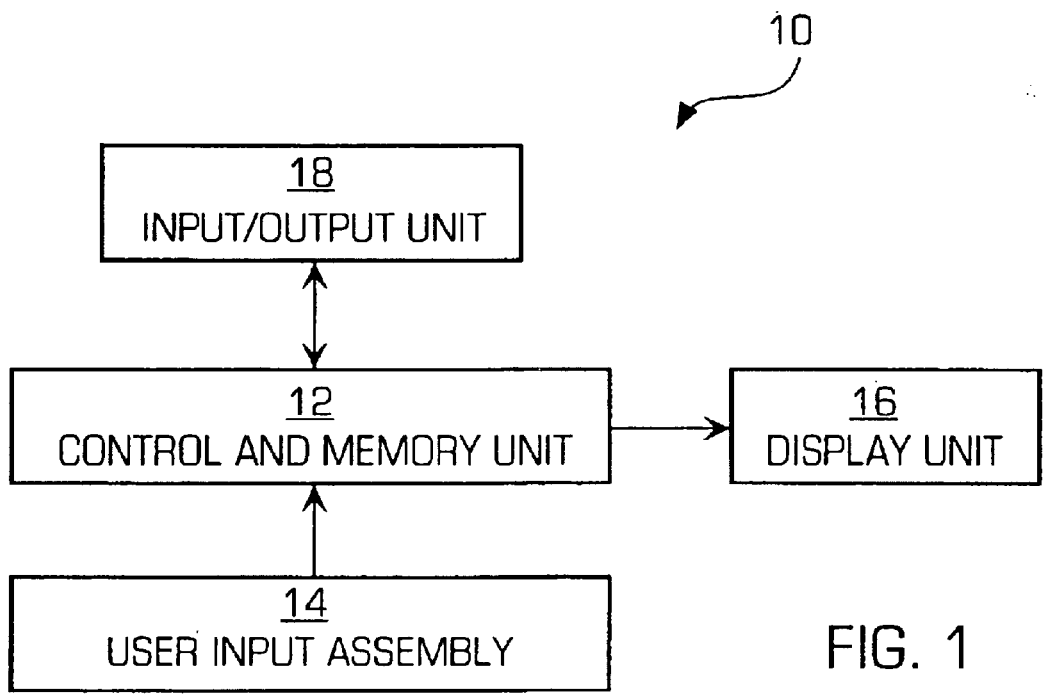
FIG. 1 is a block diagram illustrating one non-limiting embodiment of a system for analyzing error information acquired during a semiconductor fabrication process which is made in accordance with a preferred embodiment of the present invention.

FIG. 1 shows a system 10 in accordance with the present invention, and which is implemented on a computer system. Particularly, system 10 may represent a conventional and commercially available computer system, manufacturing execution system, or an independent microprocessor-based system built specifically for use with the present invention. System 10 comprises a control and memory unit 12, a user input assembly 14, a display unit 16, and an input/output unit 18.

Control and memory unit 12 may be a conventional and commercially available processor-based system including a microprocessor or microcontroller and both volatile and non-volatile memory. User input assembly 14 may be one or more conventional and commercially available input devices such as and without limitation a keyboard, mouse, touch pad, light pen, and/or any other conventional and commercially available devices suitable to permit a user to input data into system 10 (e.g., into control and memory unit 12). Input/output unit 18 may be a suitable and commercially available device or a combination of devices adapted to provide data to, and access data from, control and memory unit 12, and may comprise without limitation one or more conventional disk drives, ports and communication devices for transferring data over a local or global computer network. Input/output unit 18 may further include other conventional peripheral devices such as printers, scanners and the like. Display unit 16 may be a conventional and commercially available output display device such as and without limitation a computer monitor, a flat panel display or other conventional display device which is suitable to display output generated by computer system 10.

In one non-limiting embodiment, the present invention may comprise software or firmware contained on a storage device, mainframe computer, or network server which may be accessed and loaded into control and memory unit 12 by way of input/output unit 18. Alternatively, the present invention may be stored within the permanent or non-volatile memory of unit 12.

Figure 2:
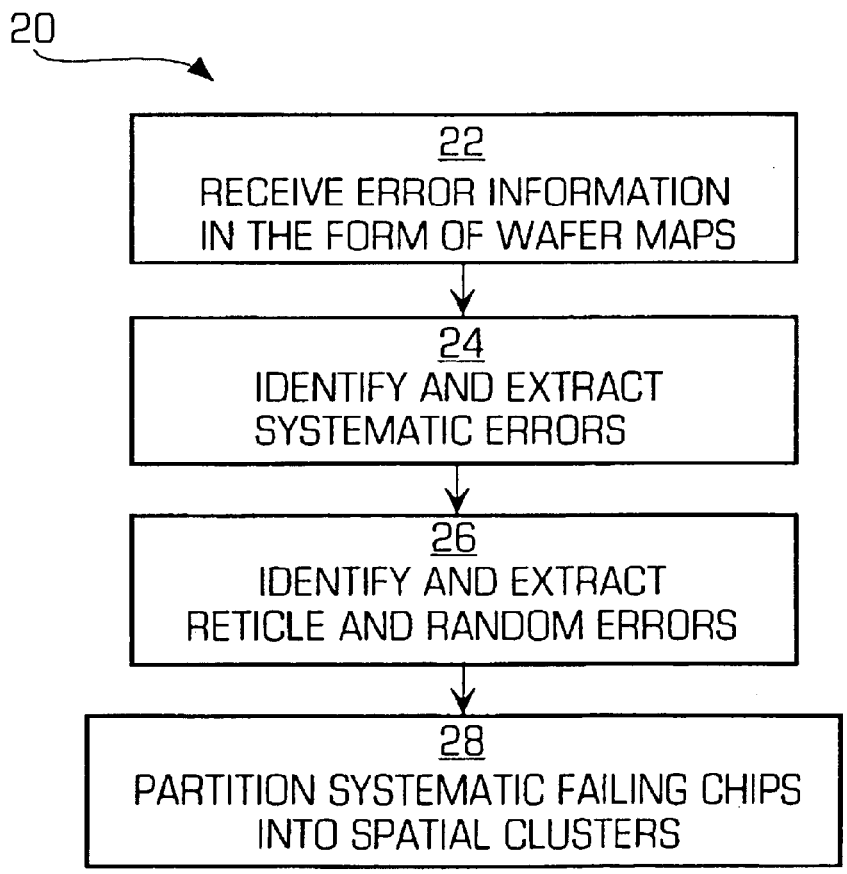
FIG. 2 is a block diagram illustrating the broad functionality employed by the system shown in FIG. 1.

FIG. 2 is a block diagram 20 illustrating the broad functionality, strategy or method used by the system 10 to extract various error information from wafer map data in a semiconductor fabrication process. Particularly, system 10 is effective to classify errors from a wafer map in one of the following categories: systematic errors, repeated or reticle errors and random errors. The strategy 20 is briefly executed as follows: system 10 receives error information regarding a semiconductor fabrication process in the form of wafer maps in functional block or step 22; system 10 identifies and extracts data representing systematic errors in functional block or step 24; system 10 identifies and extracts data representing reticle and random errors in functional block or step 26; and system 10 partitions systematic failing chips into spatial clusters in functional block or step 28. The function and/or operation of each of the foregoing steps is discussed more fully and completely below.

Figure 3:
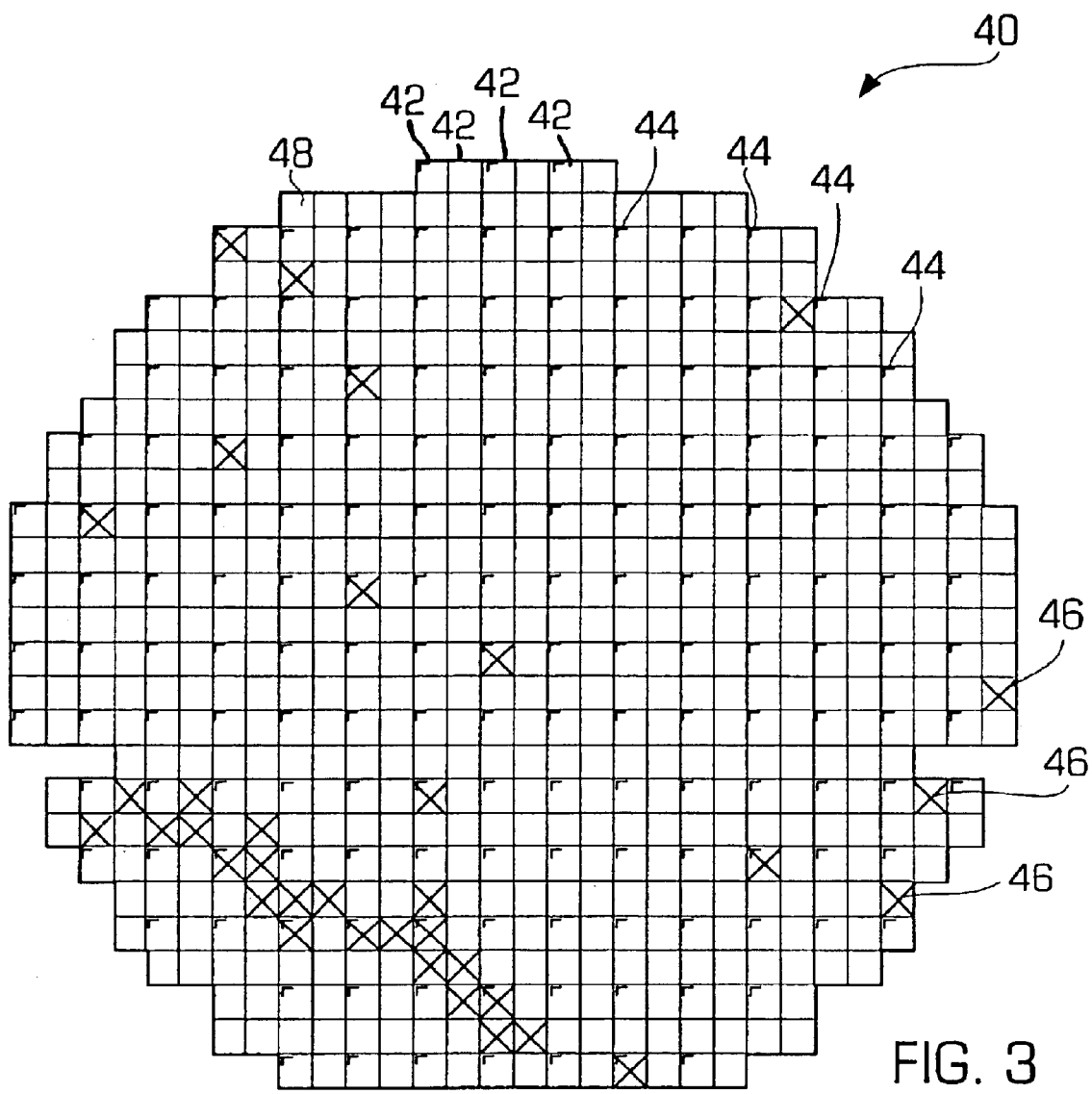
FIG. 3 is an exemplary illustration of a wafer map may which may be used by the system and method of the preferred embodiment of the invention.

In functional block or step 22, system 10 receives error information regarding the semiconductor manufacturing process in the form of wafer maps. Particularly, a wafer map illustrates the position of each of the chips on a particular wafer, with each of the chips marked to indicate whether it has "passed" (e.g., the chip functions according to various predetermined benchmarks) or "failed" (e.g., the chip does not function according to one or more predetermined benchmarks). A non-limiting example of a wafer map 40, which may be used within the present invention, is illustrated in FIG. 3.

The wafer map 40 illustrates a plurality of chips 42 arranged in a two-dimensional layout representative of the wafer on which the chips are formed. The reticles used on the wafer are superimposed on the map 40. Particularly, the reticle zones are defined as a two-by-two area. The upper right-hand corner 44 of each reticle is darkened to differentiate between each reticle on the map 40. The one or more failing chips 46 on the map 40 are labeled with an "X". While for the purposes of this illustration failing chips 46 have been labeled with an "X", it should be appreciated that wafer maps used and generated by system 10 may utilize any method of marking passing and failing chips which is suitable for image recognition purposes, such as assigning specific colors to passing and failing chips.

System 10 may receive the wafer map data in any suitable manner. For example, the wafer maps 40 may be received by system 10 over a communications network by use of input/output unit 18, or may be entered into system 10 by a user (e.g., a manufacturing engineer) through user input assembly 14. In alternate embodiments, system 10 may receive raw data describing results of post-processing tests performed on the wafers and/or data identifying particular chips on the wafers that have failed certain performance benchmarks. In such embodiments, system 10 may generate its own wafer maps in a conventional manner, based upon the raw data.

In functional block or step 24, system 10 utilizes the wafer maps 40 to identify and extract systematic type errors. Particularly, system 10 separates the failing chips that are attributed to systematic errors from other failing chips. For these purposes, system 10 defines an indicator function for each chip, $x_i$, which is used to indicate whether chip i on the wafer map 40 is a passing or failing chip. Specifically, $x_i=0$ if chip i is a passing chip, and $x_i=1$ if chip i is a failing chip.

In separating or partitioning the systematic failures from other failures (e.g., reticle failures and random failures), system 10 implements a strategy that does not examine the chips on a "one-at-a-time" basis, but rather views each chip in the context of how the chips surrounding it exhibit pass/fail patterns. This technique is commonly referred to as an image smoothing process.

Figure 4:
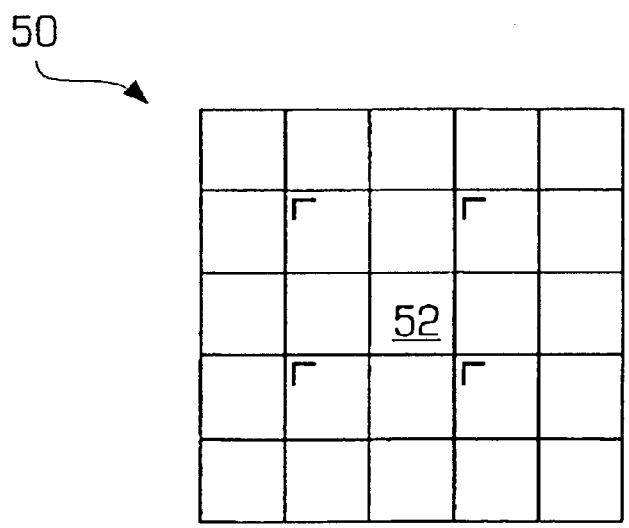
FIG. 4 is an exemplary illustration of a three-by-three neighborhood for a chip on a silicon wafer.

In the preferred embodiment of the invention, the system 10 examines all chips within a three-by-three neighborhood of a chip i. In each three-by-three neighborhood there are potentially twenty-four chips surrounding a chip i (not including the chip i). An example of a three-by-three neighborhood 50 for a chip 52 is illustrated in FIG. 4. It should be appreciated that chips in the center of a wafer will most likely have twenty-four chips surrounding them in their respective three-by-three neighborhoods, while chips at the edges of a wafer will not. For example, the chip 48 illustrated in FIG. 3 only has twelve such neighbors.

Now, system 10 defines a scaled binomial random variable function, $y_i$, for each chip i. Particularly, for each chip i, $n_i$ denotes the number of neighbors in a three-by-three neighborhood, and $y_i$ is defined as follows:

$$y_i = \sum_j x_j/n_i, \qquad \text{Equation (1)}$$

where the summation index j is over all chips in the three-by-three neighborhood, not including chip i. Each $y_i$ ranges from zero to one, inclusive, and may be thought of as a scaled binomial random variable. Alternatively, Equation (1) may be modified so that a factor of two is applied in the summation for chips directly adjacent to chip i, and a factor of one otherwise, so long as the denominator is adjusted so that each $y_i$ still ranges from zero to one.

It should be appreciated by one of ordinary skill in the art that the variance of each $y_i$ depends on $n_i$. For this reason, system 10 employs a known variance-stabilizing transformation, commonly referred to as an "ArcSin" transformation, so that the variances are constant for the purposes of the statistical tests that the strategy performs. The transformation, $z_i$, is defined by the following equation:

$$z_i = \Phi(\text{ArcSin}(y_i/n_i); \text{ArcSin}(y_i), 1/(4 \cdot n_i)) \qquad \text{Equation (2)},$$

where $\Phi(x; \mu, \sigma^2)$ denotes the probability that a normal random variable with mean $\mu$ and standard deviation $\sigma$ is less than or equal to x, the cumulative distribution function of the normal distribution. Hence, each $z_i$ also ranges from zero to one.

The strategy implemented by system 10 determines whether a failing chip i belongs in the set of systematic failures or errors by looping over a threshold, $\theta$, which ranges downward from one to zero, in a manner discussed more fully and completely below. For a given value of $\theta$, the strategy marks chip i as systematic if $z_i \geq \theta$. Thus, $\theta=0$ has the interpretation of all failing chips being systematic, and $\theta=1$ has the interpretation of all failing chips being random or repeated.

In the preferred embodiment, the strategy begins by assigning a value of 1 to $\theta$, then lowers $\theta$ in predetermined increments until the below-described test for spatial randomness passes. That is, the strategy begins with $\theta=1$ and performs the below-described test of spatial randomness with the condition that the chips that are marked as systematic are "fixed." The strategy terminates when the test of spatial randomness passes, i.e., supports the statistical conclusion that the chips that are not fixed (i.e., that are not marked as systematic), exhibit spatial randomness. The chips that were marked as systematic then represent the class of systematic failures or errors.

The test for spatial randomness implemented by system 10 employs a "joint-count" statistic, which takes a simple form for binary data (e.g., 1 for chip failing, 0 for chip passing), and may be defined by the following equation:

$$W = \sum_{i,j} w_{ij}(x_i - x_j)^2. \qquad \text{Equation (3)}$$

Here the summation is over all chips in the wafer map, $x_i=0$ if chip i is a passing chip, $x_i=1$ if chip i is a failing chip, $x_j=0$ if chip j is a passing chip, $x_j=1$ if chip j is a failing chip, and $w_{ij}$ is 1 if chip i is either vertically, horizontally or diagonally adjacent to chip j (i.e., adjacent in the sense of the possible moves of a king on a chessboard), and $w_{ij}$ is 0 otherwise.

Approximate distributions of the test statistic W may be calculated in a conventional manner when the number of chips on the wafer map is large. However, these distributions are for testing the statistical null hypothesis $H_0$: The chips are distributed randomly versus the alternative hypothesis $H_1$: The chips are not distributed randomly. In applying the test of spatial randomness for the purposes of determining systematic failures, the alternative hypothesis is $H_2$: The chips are distributed randomly except for various clusters of chips that are pre-specified (e.g., the above-defined "fixed" chips).

To calculate a distribution for W in this case, the following Monte Carlo algorithm is used. The test statistic W is calculated. Then, for a relatively large number of iterations, N (e.g., 100), the strategy randomly permutes the "non-fixed" chips without replacement (e.g., the strategy randomly assigns 1 and 0 values to the non-fixed chips). The strategy then calculates test statistic $W_i$ under each permutation. The "p-value" of the statistical test of $H_0$ versus $H_2$ is $\#\{W_i < W | 1 \leq i \leq N\}/N$, and is used to either accept or reject $H_0$ (i.e., pass or fail the test of spatial randomness) based on comparing it to a given desired level of statistical significance (e.g., 0.10). That is, for relatively small p-values (e.g., <0.10), system 10 will reject the null hypothesis, and classify the corresponding chips as systematic (i.e., resulting from systematic errors). Otherwise, the chips will be classified as other than systematic (i.e., resulting from repeated or random errors).

Figure 5:
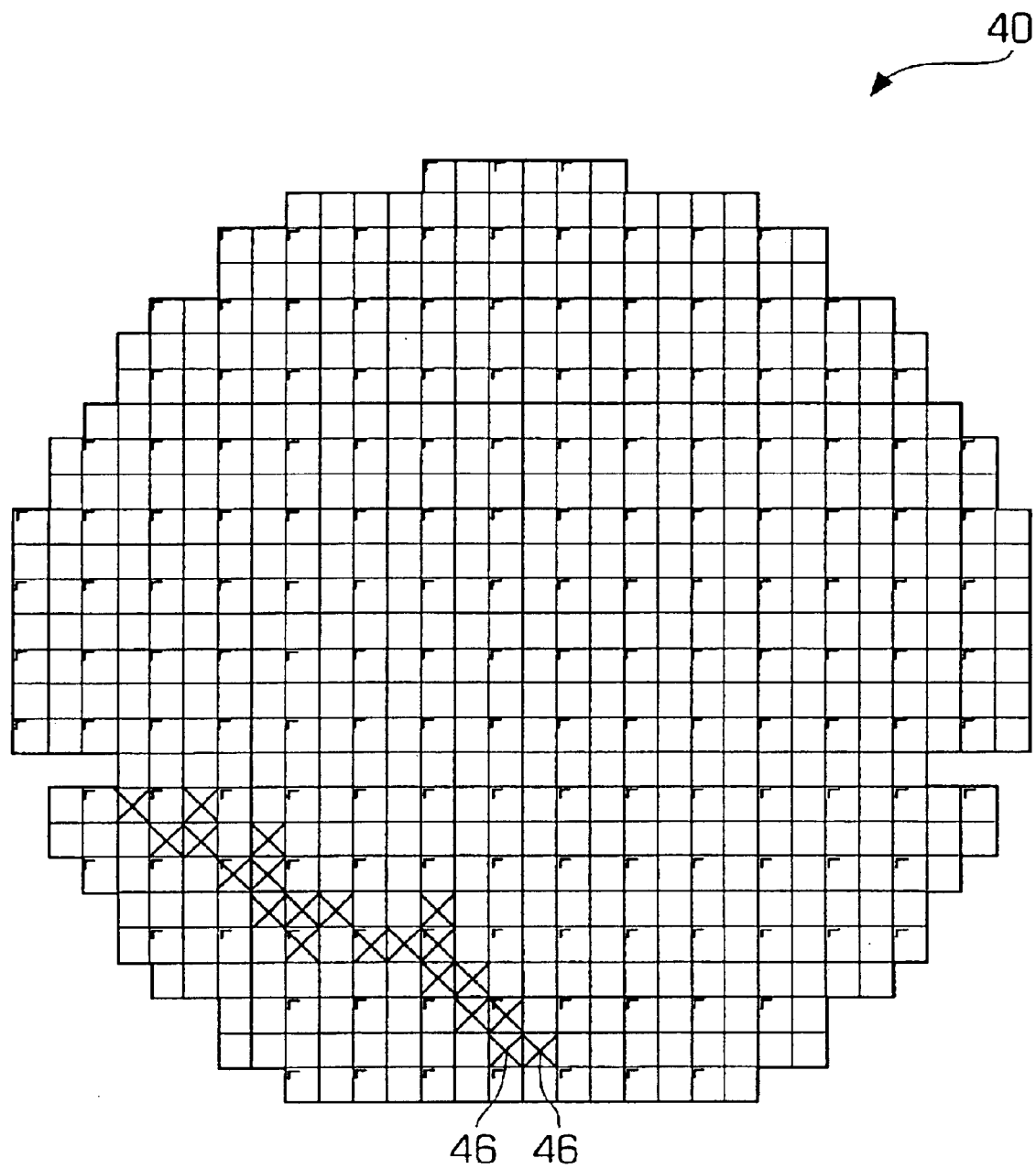
FIG. 5 is an exemplary illustration of a wafer map identifying the systematic failures of the wafer shown in FIG. 3.

In this manner, failing chips that result from systematic errors can be identified and/or segregated from other failing chips. In one non-limiting example shown in FIG. 5, the system 10 applies the foregoing strategy to wafer map 40, and displays only the failing chips 46 resulting from systematic failures, which are labeled with an "X". In the preferred embodiment, the controller 12 generates an output signal to display unit 16, effective to cause display unit 16 to display a graphical presentation of the systematic failures superimposed over the wafer map, as illustrated in FIG. 5. In alternate embodiments, system 10 may display the systematic failures in any other suitable or desirable format.

Once system 10 segregates the systematic chips in the set of failing chips, it proceeds to functional block or step 26, where it classifies the remaining failing chips as either repeated or random. Particularly, the system 10 performs a test to identify the chips resulting from repeated or reticle errors; those not so-identified are then considered random. For the purposes of the following discussion, the term "remaining chips" shall mean the remainder of failing chips after the systematic chips have been extracted.

System 10 employs the following principle in determining whether each of the remaining chips result from repeated failures: Assuming there are r chips in each reticle (e.g., for a two-by-two layout, r=4), if all of the remaining chips are distributed evenly amongst these r groups or "reticle zones," a repeated failure phenomenon should not exist. However, if the remaining chips are disproportionately represented in one more of these r groups as compared to the others, the remaining chips that are disproportionately represented will be classified as repeated failure chips. This principle may be formalized by the known chi-square test of independence.

That is, assuming there are N chips on the wafer, F failing chips on the wafer, and $N_i$ chips in each reticle zone such that $$N = \sum_{i=1}^{r} N_i, \quad \text{Equation (4)}$$

if $O_i$ failing chips are observed in each reticle zone, under the hypothesis of independence between failure and reticle zone, there should exist $E_i = N_i \cdot F/N$ failing chips in each reticle zone. The chi-square test of independence may then be provided by the following equation:

$$\chi^2 = \sum_{i=1}^{r} \frac{(O_i - E_i)^2}{E_i}. \quad \text{Equation (5)}$$

The number of failing chips in reticle zone i may be denoted by $F_i$, and the order statistics thereof may be denoted as follows:

$$F_{(1)} \leq F_{(2)} \leq \ldots \leq F_{(r)} \quad \text{Equation (6).}$$

If the chi-square test fails (by comparing the test statistic above to the appropriate percentile of the chi-square distribution with r-1 degrees of freedom), and $$F_{(r)} - F/r > F/r - F_{(1)} \quad \text{Equation (7)}$$

(i.e., the count of the reticle zone with the highest failure count is a greater distance from the average reticle zone count than the count of the reticle zone with the lowest failure count), all failing chips in the reticle zone with the highest failure count are marked as repeated failure chips. If the chi-square test failed, the system 10 repeats the chi-square test on the remaining reticle zones, and so on, until the chi-square test for independence passes.

Figure 6:
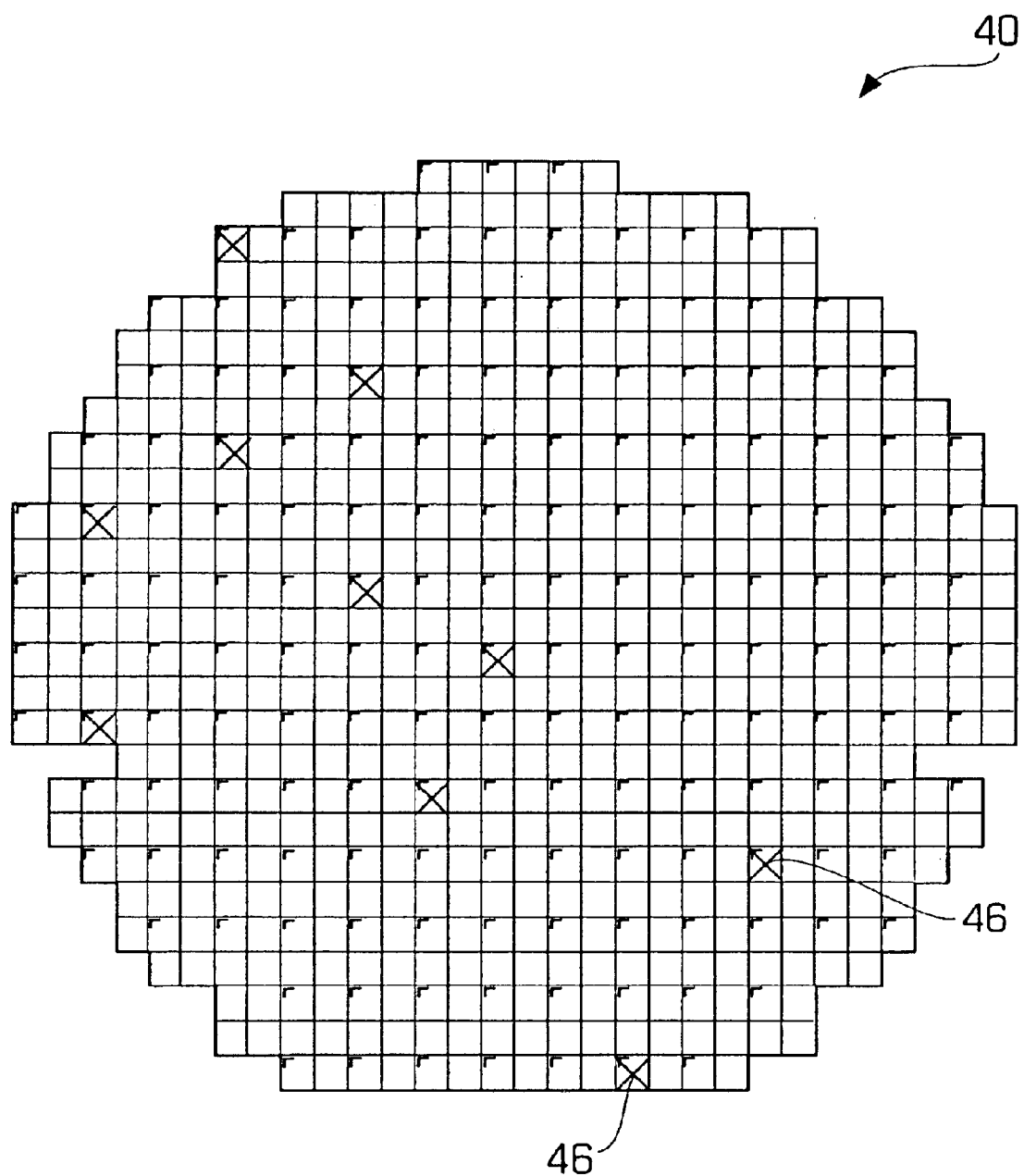
FIG. 6 is an exemplary illustration of a wafer map identifying the repeated failures of the wafer shown in FIG. 3.
Figure 7:
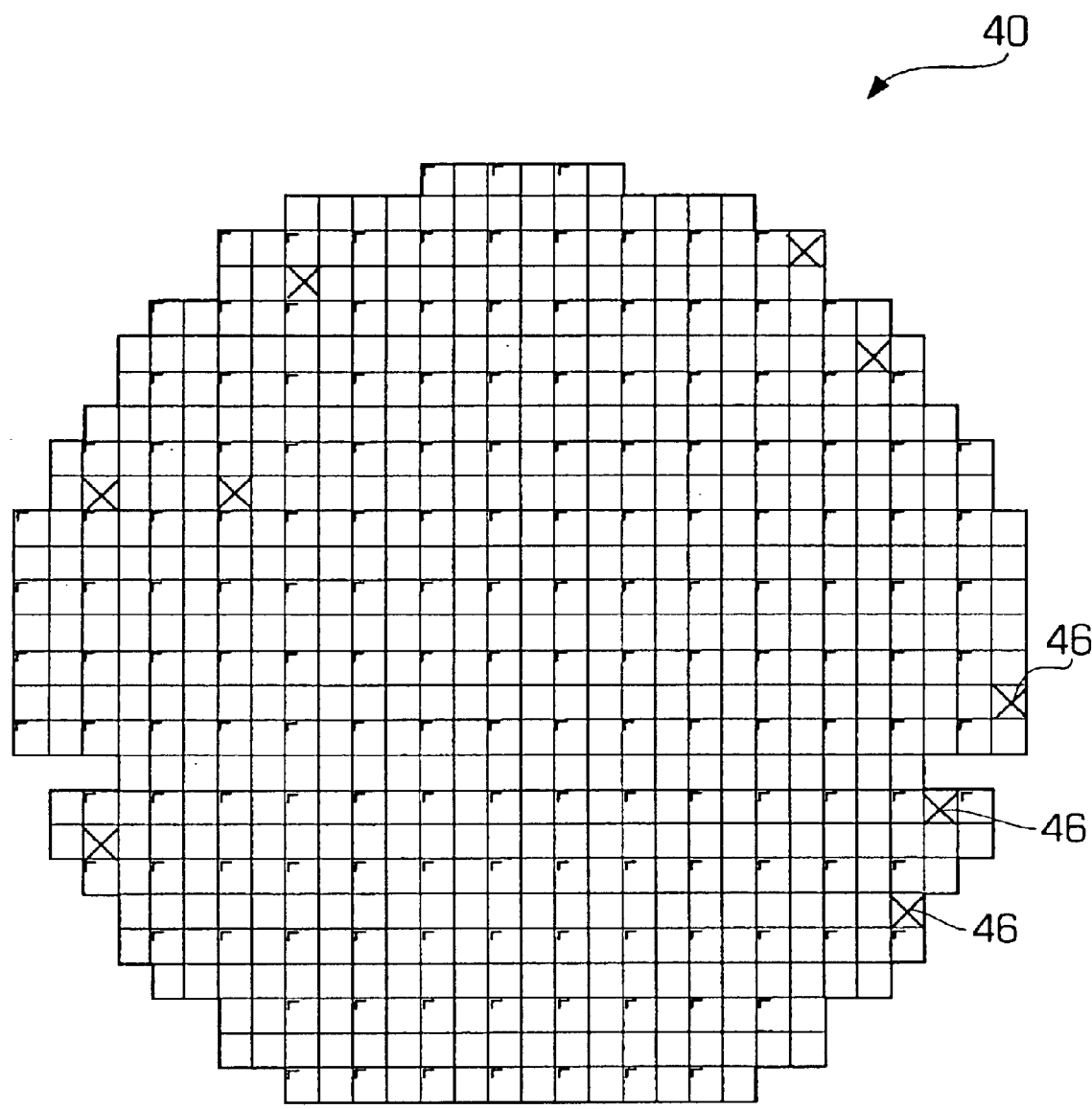
FIG. 7 is an exemplary illustration of a wafer map identifying the random failures of the wafer shown in FIG. 3.

In this manner, failing chips that result from repeated (e.g., reticle) errors and random errors can be identified and/or segregated. In one non-limiting example shown in FIG. 6, the system 10 applies the foregoing strategy to wafer map 40, and displays only the failing chips 46 resulting from repeated failures, which are labeled with an "X". Once the repeated failures have been extracted, system 10 may further display only the failing chips 46 resulting from random errors, as shown in FIG. 7. In the preferred embodiment, the controller 12 generates an output signal to display unit 16, effective to cause display unit 16 to display graphical presentations of the repeated failures and random failures superimposed over the wafer map, as illustrated in FIGS. 6 and 7, respectively. In alternate embodiments, system 10 may display the repeated and systematic failures in any other suitable or desirable format.

Once all of the failing chips have been identified, system 10 may provide printed images of the various classified chips, and/or graphical comparisons and/or analysis of the systematic, repeated and random failures (e.g., by use of display unit 16 and input/output unit 18). In one non-limiting embodiment, system 10 may calculate and display the systematic, repeated and random yields for each wafer, which may be defined by the following equations:

$$\text{Yield}_{systematic} = 1 - N_s/N \quad \text{Equation (8),}$$

$$\text{Yield}_{repeated} = 1 - N_{re}/N \quad \text{Equation (9),}$$

and $$\text{Yield}_{random} = 1 - N_{ra}/N \quad \text{Equation (10),}$$

where N is the total number of chips on the wafer, $N_s$ is the total number of failed chips classified as systematic failures, $N_{re}$ is the total number of failed chips classified as repeated failures, and $N_{ra}$ is the total number of failed chips classified as random failures. System 10 may also communicate the foregoing information to other portions of the manufacturing execution system or to other computer systems for further analysis.

Additionally, system 10 may perform further analysis on the failing chips that have been designated as systematic, as set forth functional block or step 28 of FIG. 2. Particularly, system 10 may further partition the identified systematic failing chips into different spatial clusters for the purposes of feeding each spatial cluster into conventional image recognition software that can be used to identify spatial signatures present within the systematic chips, in order to determine the origin or cause of the failure.

For example, a wafer map may exhibit multiple distinct systematic spatial patterns, as well as failures due to random and reticle factors. Known software algorithms exist (e.g., image recognition or spatial signature analysis software) to compare systematic spatial patterns against a known library of spatial patterns for the purposes of automatic identifying the respective origins of the systematic errors. A match of a spatial pattern against a known library of similar patterns is helpful, because the corrective action that was ultimately undertaken with respect to the spatial pattern in the library usually will aid in correcting the problem currently under consideration.

System 10 implements a conventional "flood fill" algorithm to partition the systematic failing chips into different spatial clusters. By way of example, assume Colors[1 . . . n] is an array of n different colors used to mark the different clusters in the systematic wafer map. The color of each chip in the wafer map of systematic failing chips may be marked with 0. Color is then set equal to 1. System 10 loops over each chip in the wafer map. If the color of the chip is 0, system 10 calls a Fill recursive algorithm (defined below) with the coordinates of the chip. System 10 then increments Color and repeats the procedure.

The Fill(x, y) algorithm may be defined as follows:
a. Set the color of chip (x, y) to Colors[Color].
b. If the color of chip (x−1, y) is 0 (and that chip exists), Fill(x−1, y).
c. If the color of chip (x+1, y) is 0 (and that chip exists), Fill(x+1, y).
d. And so on for all the chips in a three-by-three neighborhood about (x, y).

Figure 8:
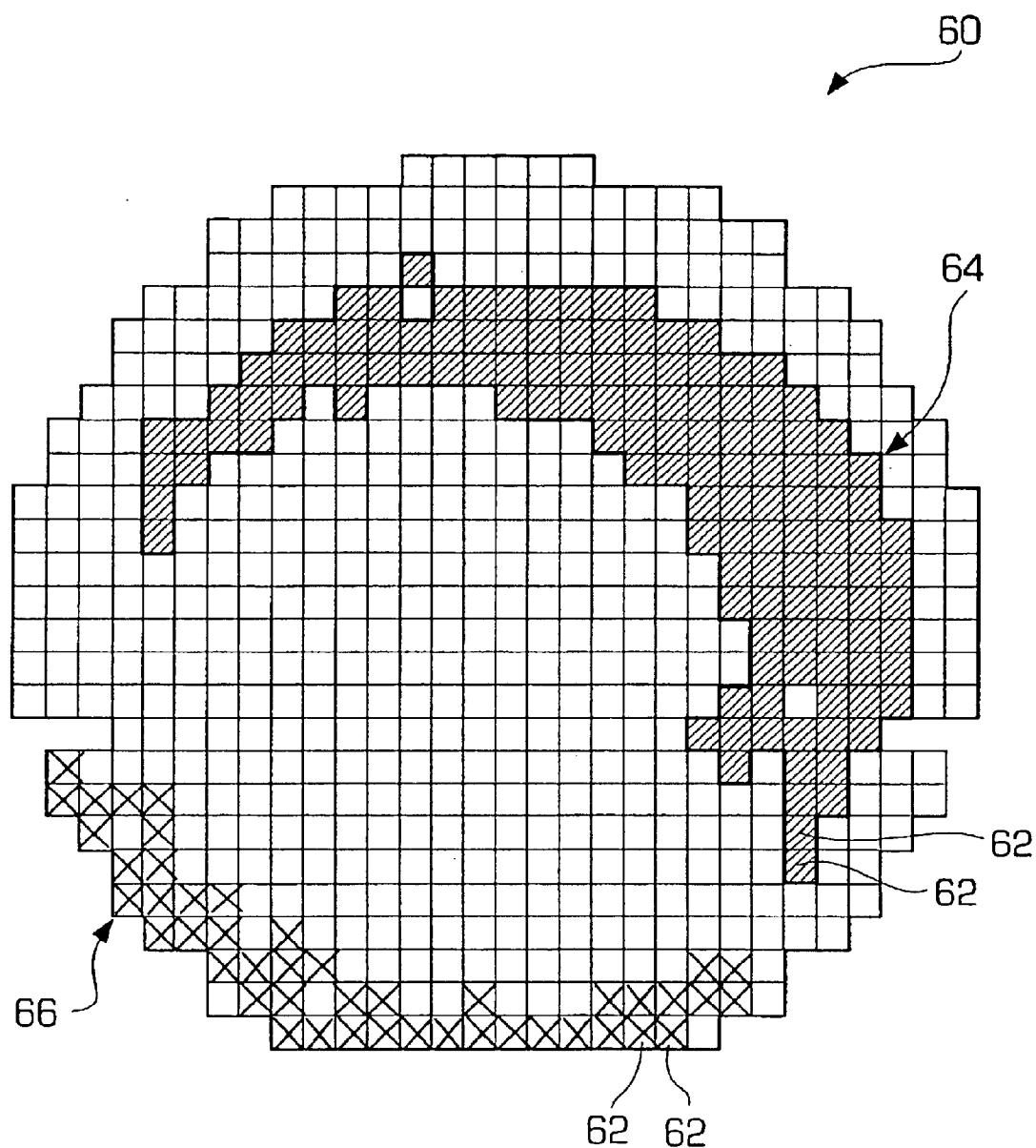
FIG. 8 is an exemplary illustration of a wafer map with systematic failing chips partitioned into a pair of spatial clusters.

One non-limiting example of systematic failing chips that have been partitioned into spatial clusters in accordance with the foregoing procedure is illustrated in the wafer map 60 of FIG. 8. All chips 62 shown in map 60 have been classified by system 10 as systematic errors. The foregoing partitioning procedure was performed, to further segregate the chips 62 into a first spatial cluster 64, in which the chips 62 have been blackened, and a second spatial cluster 66, in which the chips 62 are marked with an "X". It should be appreciated that in the preferred embodiment, clusters 64 and 66 will be each marked or filled with a unique color when displayed. In this manner, the system 10 allows the partitioned clusters 64, 66 to be relatively easily compared against a known library of spatial patterns for the purposes of identifying the cause of the errors and associated corrective actions that may be helpful.

The present invention accurately classifies each of the failing chips on a wafer in a unique one of a plurality of error categories, such as systematic, random and repeated type errors. This allows a fabrication engineer or professional to provide corrective action which is purposely designed to overcome the specific type of errors or failures encountered. It should further be appreciated that in other embodiments, the system 10 may be used to classify errors in different and/or additional types of categories or subcategories.

While the foregoing has been with reference to a particular embodiment of the invention, it will be appreciated by those skilled in the art that changes in this embodiment may be made without departing from the principles and spirit of the invention, the scope of which is defined by the appended claims.

What is claimed is:

1. A system for analyzing error information describing a plurality of failing chips on a semiconductor wafer, comprising:
    a controller which is adapted to receive said error information in the form of a wafer map and to classify each of said plurality of failing chips in a unique one of a plurality of error categories, based on said wafer map.

2. The system of claim 1 wherein said plurality of error categories comprises a systematic error category.

3. The system of claim 2 wherein said plurality of error categories further comprises a repeated error category.

4. The system of claim 3 wherein said plurality of error components further comprises a random error category.

5. The system of claim 4 further comprising:
    a display unit which is communicatively coupled to said controller and which is adapted to provide a graphical presentation of each of said plurality of error categories superimposed over a wafer map image.

6. The system of claim 5 further comprising:
    an input assembly which is communicatively coupled to said controller and which is adapted to allow a user to enter said error information into said controller.

7. The system of claim 2 wherein said controller implements a test for spatial randomness to determine whether each of said failing chips is classified in the systematic error category, said test for spatial randomness employing a test statistic of the form:

$$W = \sum_{i,j} w_{i,j}(x_i - x_j)^2$$

where the summation is over all chips on said wafer map, $x_i=0$ if chip i is a passing chip, $x_i=1$ if chip i is a failing chip, $x_j=0$ if chip j is a passing chip, $x_j=1$ if chip j is a failing chip, and $w_{ij}$ is 1 if chip i is adjacent to chip j, and $w_{ij}$ is 0 otherwise.

8. The system of claim 4 wherein said controller implements a chi-square test of independence to determine whether each of said failing chips is classified in the category of repeated failures, said chi-square test of independence being of the form:

$$\chi^2 = \sum_{i=1}^{r} \frac{(O_i - E_i)^2}{E_i}$$

where there are r chips in each reticle used on said wafer, $O_i$ is the number of failing chips observed in each reticle zone i, and $$E_i = N_i \cdot F/N$$

where N is the total number of chips on said wafer, F is the total number of failing chips on said wafer, and $N_i$ is the total number of chips in each reticle zone i.

9. A system for analyzing error information describing a plurality of failing chips on a semiconductor wafer, comprising:
    an input assembly which is adapted to accept and communicate said error information in the form of a wafer map; and
    a controller which is communicatively coupled to said input assembly and which receives said wafer map from said input assembly, said controller being adapted to classify each of said failing chips in a unique one of the group of categories including systematic failures, repeated failures and random failures, based upon said wafer map.

10. The system of claim 9 wherein said controller is further adapted to partition failing chips in the category of systematic failures into a plurality of spatial clusters.

11. The system of claim 9 wherein said controller implements a test for spatial randomness to determine whether each of said failing chips is classified in the category of systematic failures.

12. The system of claim 11 wherein said test for spatial randomness employs a test statistic of the form:

$$W = \sum_{i,j} w_{i,j}(x_i - x_j)^2$$

where the summation is over all chips on said wafer map, $x_i=0$ if chip i is a passing chip, $x_i=1$ if chip i is a failing chip, $x_j=0$ if chip j is a passing chip, $x_j=1$ if chip j is a failing chip, and $w_{ij}$ is 1 if chip i is adjacent to chip j, and $w_{ij}$ is 0 otherwise.

13. The system of claim 12 wherein said controller implements a chi-square test of independence to determine whether each of said failing chips is classified in the category of repeated failures.

14. The system of claim 13 wherein said chi-square test of independence is of the form:

$$\chi^2 = \sum_{i=1}^{r} \frac{(O_i - E_i)^2}{E_i}$$

where there are r chips in each reticle used on said wafer, $O_i$ is the number of failing chips observed in each reticle zone i, and $$E_i = N_i \cdot F/N$$

where N is the total number of chips on said wafer, F is the total number of failing chips on said wafer, and $N_i$ is the total number of chips in each reticle zone i.

15. A computerized method for analyzing error information from a semiconductor manufacturing process, comprising:
receiving wafer map data identifying a plurality of failing chips on a semiconductor wafer; and
automatically classifying each of said failing chips in a unique one of the group of categories including systematic errors, repeated errors, and random errors, based upon said wafer map data.

16. The method of claim 15 further comprising:
partitioning failing chips in the category of systematic errors into a plurality of spatial clusters.

17. The method of claim 15 wherein said failing chips are classified in the category of systematic errors by use of a test for spatial randomness.

18. The method of claim 17 wherein said test for spatial randomness employs a test statistic of the form:

$$W = \sum_{i,j} w_{i,j}(x_i - x_j)^2$$

where the summation is over all chips on said wafer map, $x_i=0$ if chip i is a passing chip, $x_i=1$ if chip i is a failing chip, $x_j=0$ if chip j is a passing chip, $x_j=1$ if chip j is a failing chip, and $w_{ij}$ is 1 if chip i is adjacent to chip j, and $w_{ij}$ is 0 otherwise.

19. The method of claim 15 wherein said failing chips are classified in the categories of repeated failures and random failures by use of a chi-square test of independence.

20. The method of claim 19 wherein said chi-square test of independence is of the form:

$$\chi^2 = \sum_{i=1}^{r} \frac{(O_i - E_i)^2}{E_i}$$

where there are r chips in each reticle used on said wafer, $O_i$ is the number of failing chips observed in each reticle zone i, and $$E_i = N_i \cdot F/N$$

where N is the total number of chips on said wafer, F is the total number of failing chips on said wafer, and $N_i$ is the total number of chips in each reticle zone i.

* * * * *